US012284767B2

(12) United States Patent
Koshimizu

(10) Patent No.: US 12,284,767 B2
(45) Date of Patent: Apr. 22, 2025

(54) METHOD FOR MANUFACTURING WIRING BOARD, WIRING BOARD, METHOD FOR MANUFACTURING MOLDED OBJECT, MOLDED OBJECT

(71) Applicant: Fujikura Ltd., Tokyo (JP)

(72) Inventor: Kazutoshi Koshimizu, Chiba (JP)

(73) Assignee: Fujikura Ltd., Tokyo (JP)

( * ) Notice: Subject to any disclaimer, the term of this patent is extended or adjusted under 35 U.S.C. 154(b) by 233 days.

(21) Appl. No.: 17/779,898

(22) PCT Filed: Nov. 18, 2020

(86) PCT No.: PCT/JP2020/042995
§ 371 (c)(1),
(2) Date: May 25, 2022

(87) PCT Pub. No.: WO2021/106713
PCT Pub. Date: Jun. 3, 2021

(65) Prior Publication Data
US 2023/0007781 A1    Jan. 5, 2023

(30) Foreign Application Priority Data
Nov. 25, 2019   (JP) ................. 2019-212302

(51) Int. Cl.
*H05K 3/04*    (2006.01)
*H05K 1/03*    (2006.01)
(Continued)

(52) U.S. Cl.
CPC .......... *H05K 3/048* (2013.01); *H05K 1/0353* (2013.01); *H05K 3/101* (2013.01); *H05K 3/1258* (2013.01);
(Continued)

(58) Field of Classification Search
CPC ...... H05K 3/048; H05K 3/101; H05K 3/1258; H05K 2203/0574; H05K 2203/0582;
(Continued)

(56) References Cited

U.S. PATENT DOCUMENTS

| 4,401,521 A | * | 8/1983 | Ohmura | ................. | H05K 3/205 |
| | | | | | 156/150 |
| 6,197,145 B1 | * | 3/2001 | Todd | .................... | H05K 3/0064 |
| | | | | | 29/841 |
| 11,337,304 B2 | * | 5/2022 | Koshimizu | .......... | H05K 1/0283 |

FOREIGN PATENT DOCUMENTS

| CN | 106024387 A | 10/2016 |
| CN | 108778011 A | 11/2018 |

(Continued)

OTHER PUBLICATIONS

International Search Report issued in corresponding International Application No. PCT/JP2020/042995 mailed Feb. 2, 2021 (6 pages).

*Primary Examiner* — Donghai D Nguyen
(74) *Attorney, Agent, or Firm* — Osha Bergman Watanabe & Burton LLP

(57) ABSTRACT

A method for manufacturing a wiring board includes: disposing a first resist material on a substrate; forming a first resist layer by curing the first resist material; forming a resin layer on a release film; forming a conductor portion on the resin layer; covering the conductor portion by disposing a second resist material on the resin layer; forming a second resist layer by curing the second resist material; bringing the first resist layer into contact with the second resist layer, and thereafter bonding the first resist layer and the second resist layer by thermocompression bonding; and releasing the release film from the resin layer.

7 Claims, 9 Drawing Sheets

(51) Int. Cl.
*H05K 3/10* (2006.01)
*H05K 3/12* (2006.01)

(52) U.S. Cl.
CPC .............. *H05K 2201/09118* (2013.01); *H05K 2203/0574* (2013.01); *H05K 2203/0582* (2013.01)

(58) Field of Classification Search
CPC ........... H05K 3/207; H05K 2203/1105; H05K 3/0014; H05K 1/0353; H05K 2201/09118; Y10T 20/49158
See application file for complete search history.

(56) References Cited

FOREIGN PATENT DOCUMENTS

| | | |
|---|---|---|
| JP | H07-007242 A | 1/1995 |
| JP | H07-039230 B2 | 5/1995 |
| JP | H10-051108 A | 2/1998 |
| JP | 2002-305334 A | 10/2002 |
| JP | 2003-264368 A | 9/2003 |
| JP | 2006-285179 A | 10/2006 |
| JP | 2011-180228 A | 9/2011 |
| JP | 2018-142750 A | 9/2018 |
| JP | 2018-148150 A | 9/2018 |
| JP | 2019-137070 A | 8/2019 |
| TW | 201338658 A | 9/2013 |
| TW | 201643909 A | 12/2016 |
| WO | 2016/208371 A1 | 12/2016 |

\* cited by examiner

FIG. 6
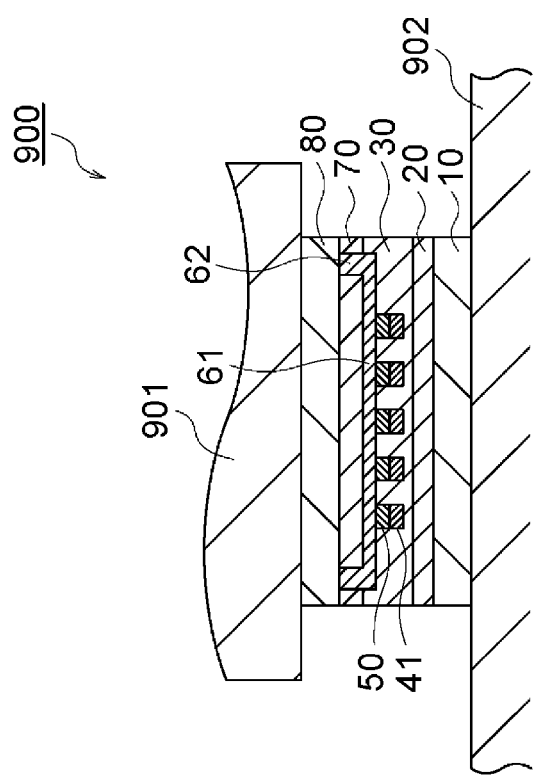
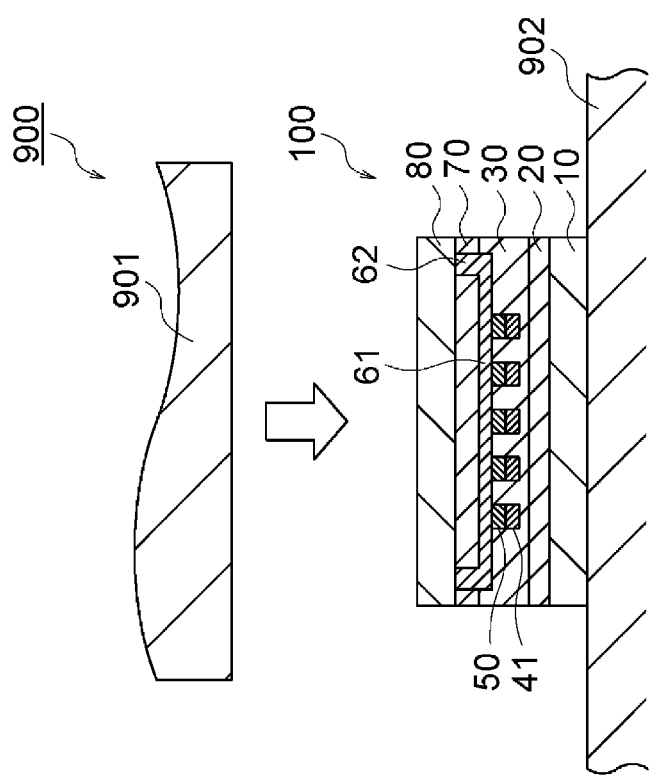

FIG. 9
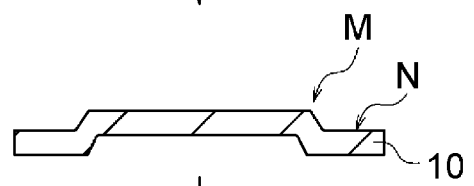
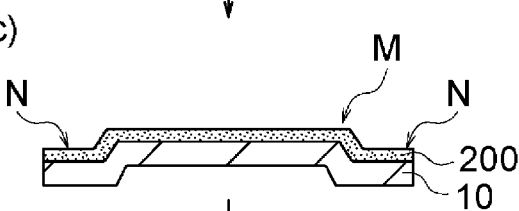
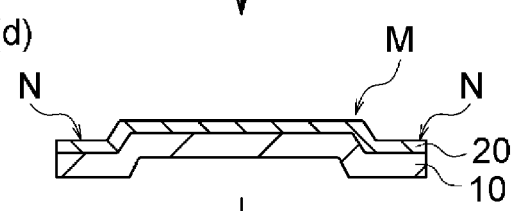
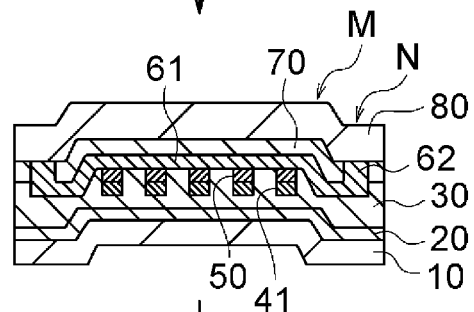
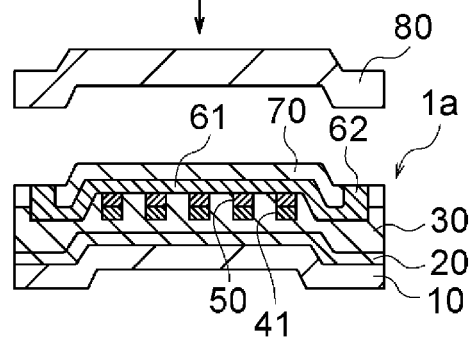
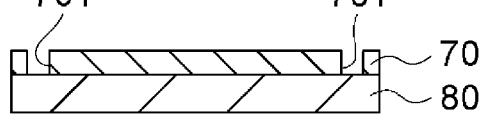
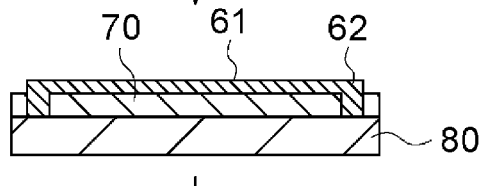
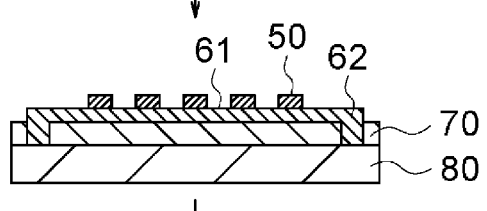
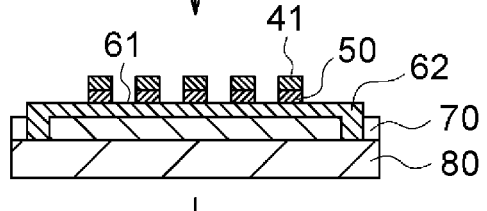
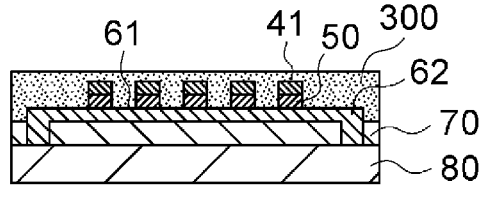
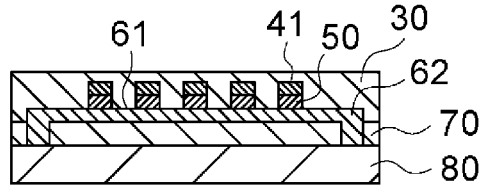

METHOD FOR MANUFACTURING WIRING BOARD, WIRING BOARD, METHOD FOR MANUFACTURING MOLDED OBJECT, MOLDED OBJECT

TECHNICAL FIELD

The present invention relates to a method of manufacturing a wiring board for a molded object, a wiring board for the molded object, and a method of manufacturing the molded object.

For designated countries that are permitted to be incorporated by reference in the literature, the contents of Patent Application No. 2019-212302, filed with Japan Patent Office on Nov. 25, 2019 are incorporated herein by reference and are regarded as a part of the description of this specification.

BACKGROUND

The molded body is made by molding a conductive laminate (for example, refer to Patent Document 1). The conductive laminate includes a substrate, an undercoat layer laminated on substrate, a nanocarbon layer laminated on the undercoat layer, and an overcoat layer laminated on the nanocarbon layer. The undercoat layer, the nanocarbon layer, and the overcoat layer are formed by repeating heating and drying the coating liquid after coating the coating liquid.

Patent Document

Patent Document 1: WO 2016/208371 A1

In the conductive laminate for molding as described above, a resin having low heat resistance and a large coefficient of linear expansion such as a polycarbonate resin or an ABS resin (acrylonitrile-butadiene-styrene copolymer synthetic resin) is used as a substrate. Therefore, when repeating the drying process of the coating liquid in order to produce a conductive laminate as described above, substrate made of the resin is repeatedly heated, shrinkage and distortion in substrate is generated, then there is a problem that breakage may occur in the nanocarbon layer.

SUMMARY

One or more embodiments of the present invention provide a method for manufacturing a wiring board and a wiring board capable of suppressing the occurrence of breakage in a conductor portion.

[1] A method for manufacturing a wiring board according to the present invention comprises: a first disposing step of disposing a first resist material on a substrate; a first curing step of forming a first resist layer by curing the first resist material; a first forming step of forming a resin layer on a release film; a second forming step of forming a conductor portion on the resin layer; a second disposing step of disposing a second resist material on the resin layer to cover the conductor portion; a second curing step of forming a second resist layer by curing the second resist material; a contact step of bringing the first resist layer into contact with the second resist layer; a thermocompression bonding step of bonding the first resist layer and the second resist layer by a thermocompression bonding after the contact step; and a releasing step of releasing the release film from the resin layer.

[2] A method for manufacturing a wiring board according to the present invention comprises: a first disposing step of disposing a first resist material on a substrate; a first forming step of forming a resin layer on a release film; a second forming step of forming a conductor portion on the resin layer; a second disposing step of disposing a second resist material on the resin layer to cover the conductor portion; a contact step of bringing the first resist material into contact with the second resist material; a curing step of curing the first resist material and the second resist material to form a first resist layer and a second resist layer; and a releasing step of releasing the release film from the resin layer.

[3] In the above invention, the first resist layer may have a breaking elongation of 50% or more at 100° C. and the second resist layer may have a breaking elongation of 50% or more at 100° C.

[4] In the above invention, a composition of the first resin material may be same as a composition of the second resin material.

[5] In the above invention, the conductor portion may comprise a first conductor portion and a second conductor portion, the wiring board may comprise an insulation layer interposed between the first and second conductor portion, the second forming step may comprise: forming the second conductor portion on the resin layer; forming the insulation layer on at least a part of the second conductor portion; and forming the first conductor portion on the resin layer and the insulation layer.

[6] In the above invention, the substrate may be composed of acrylonitrile-butadiene-styrene (ABS) resin or polycarbonate.

[7] A method for manufacturing a molded object according to the present invention comprises: the above method for manufacturing the wiring board according; and a molding step of forming a molded portion by molding at least a part of the wiring board produced by the method for manufacturing the wiring board into a three-dimensional shape, and wherein at least a part of the conductor portion is positioned in the molded portion.

[8] A method for manufacturing a molded object according to the present invention comprises the above method for manufacturing the wiring board according. The method for manufacturing a molded object comprises a molding step of forming a molded portion by molding at least a part of the substrate into a three-dimensional shape before the first disposing step. At least a part of the conductor portion is positioned on the molded portion through the first and second resin layers.

[9] A wiring board according to the present invention comprises: a substrate; a first resist layer formed on the substrate; a second resist layer formed on the first resist layer; a conductor portion formed on the second resist layer; an overcoat layer formed on the second resist layer to cover at least a part of the conductor portion.

[10] In the above invention, the first resist layer may have a breaking elongation of 50% or more at 100° C. and the second resist layer may have a breaking elongation of 50% or more at 100° C.

[11] In the above invention, a composition of the first resin layer may be same as a composition of the second resin layer.

[12] In the above-described invention, the conductor portion may comprise a first conductor portion and a second conductor portion, the wiring board may comprise an insulation layer interposed between the first and second conductor portion, the first conductor portion may be formed on the second resist layer, and the second conductor portion may be formed on the second resist layer and the insulation layer.

[13] In the above invention, the substrate may be composed of acrylonitrile-butadiene-styrene (ABS) resin or polycarbonate.

[14] A molded object according to the present invention comprises the above wiring board. The wiring board comprises a molded portion formed by molding at least a part of the wiring board into a three-dimensional shape. At least a part of the conductor portion is positioned in the molded portion.

In the present invention, since the resin layer, the conductor portion, and the second resist layer are formed on the release film and then these layers and the portion are transferred onto the substrate without forming these layers and the portion with respect to the substrate, heating is not repeated with respect to the substrate. Therefore, in the present invention, the occurrences of shrinkage and distortion of the substrate can be suppressed, and the occurrence of breakage in conductor portion can be suppressed. Further, when the second resist layer directly adheres to the substrate, sufficient peel strength is not obtained, and the second resist layer is peeled off from the substrate. In the present invention, the second resist layer is transferred to the substrate via the first resist layer, it is possible to obtain sufficient peel strength and suppress the occurrence of the above peeling.

BRIEF DESCRIPTION OF THE DRAWINGS

FIGS. 6 (*a*) and 6 (*b*) are cross-sectional views for explaining thermocompression bonding step shown in FIG. 5 (*i*) in detail;

FIGS. 9 (*a*) to 9 (*l*) are cross-sectional views illustrating another example of a method for manufacturing a molded object according to one or more embodiments of the present invention.

DETAILED DESCRIPTION

Hereinafter, one or more embodiments of the present invention will be described with reference to the drawings.

Figure 1:
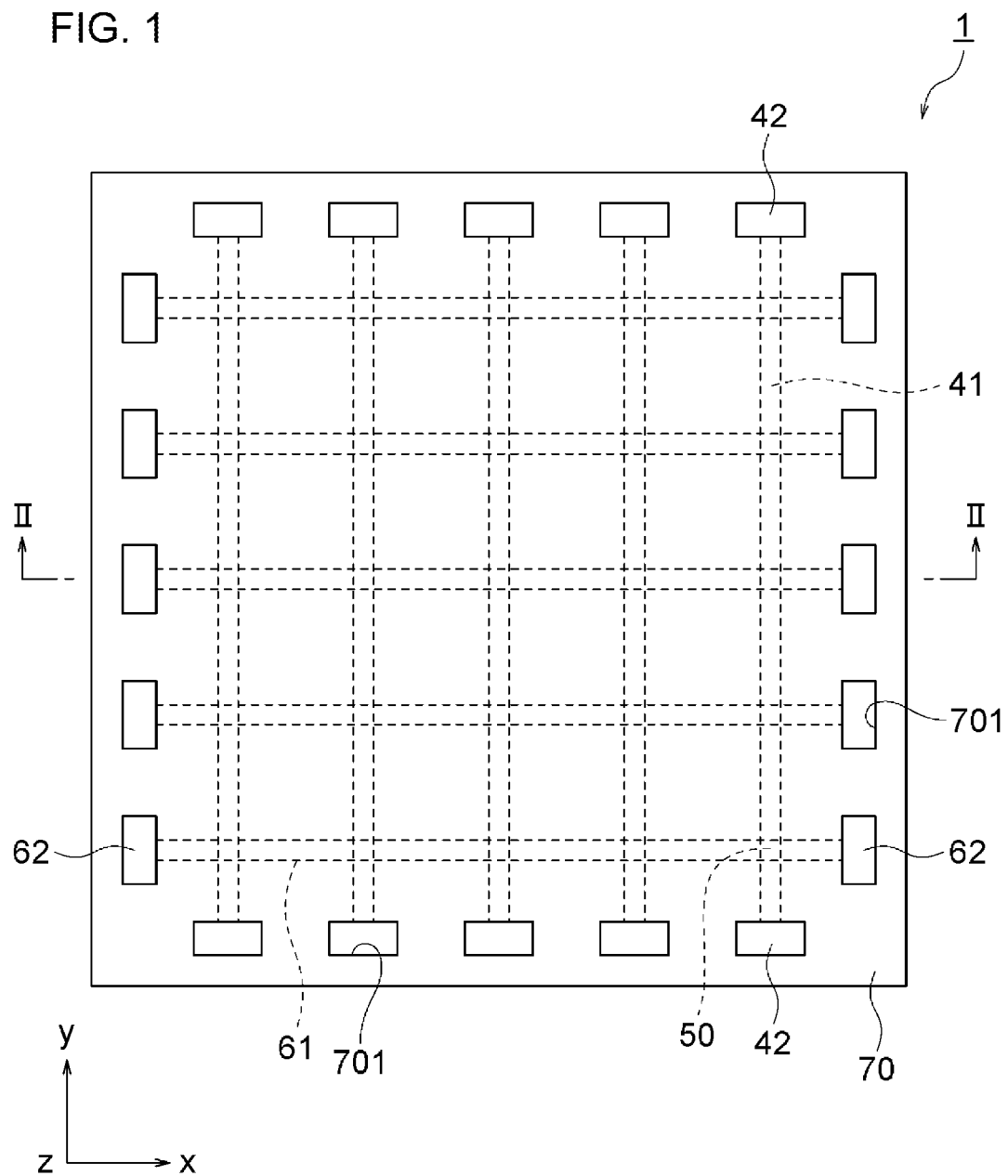
FIG. 1 is a plan view showing a wiring board in one or more embodiments of the present invention.
Figure 2:
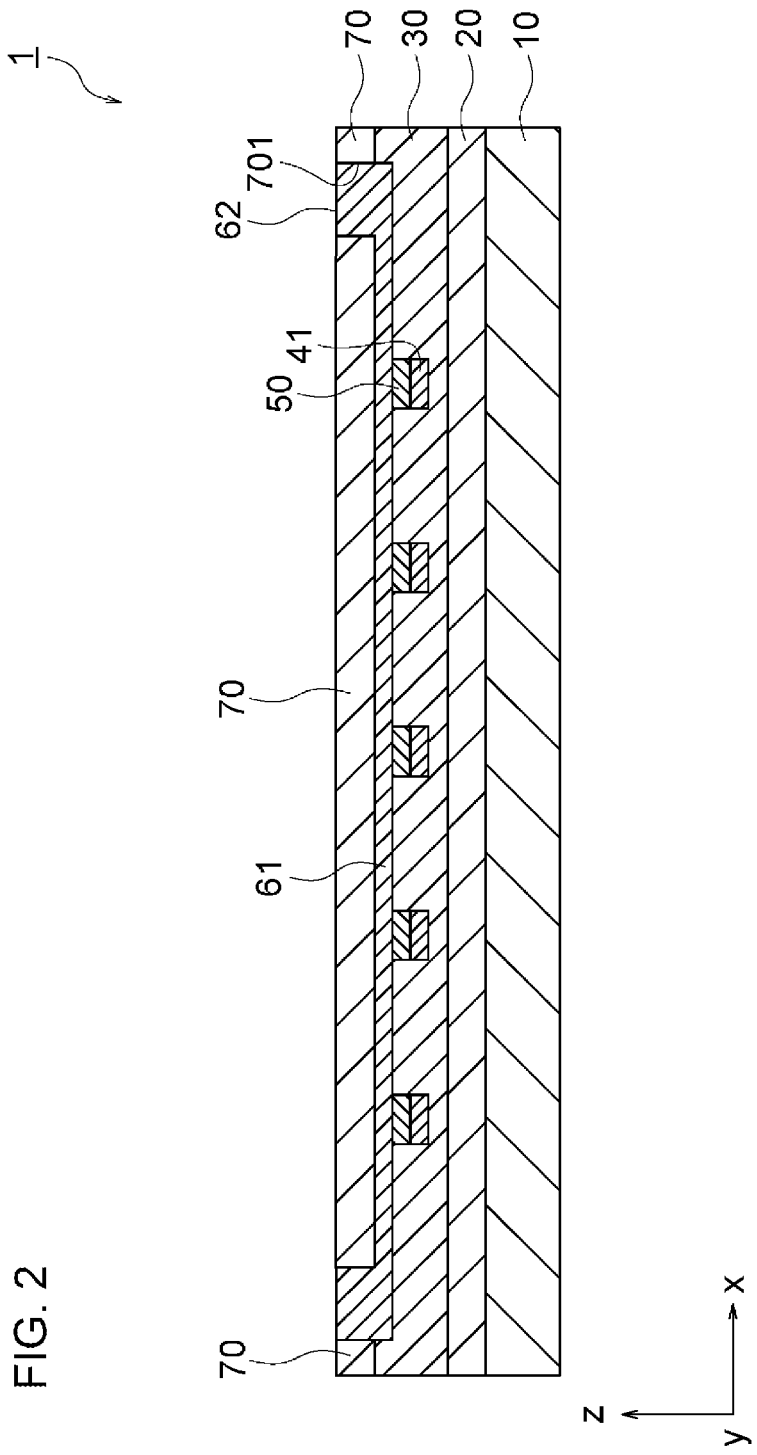
FIG. 2 is a cross-sectional view showing a cross section along II-II of FIG. 1.

FIG. 1 is a plan view showing a wiring board 1 in one or more embodiments, FIG. 2 is a cross-sectional view showing a cross section along II-II of FIG. 1. The wiring board 1 in one or more embodiments corresponds to an example of "a wiring board" in the present invention.

The wiring board 1 in one or more embodiments is a wiring board for molding. This wiring board is to be molded into a predetermined three-dimensional shape by being thermoformed or vacuum formed. The wiring board 1 is incorporated into an electronic device or the like after being molded. The wiring board 1 of one or more embodiments is used in a touch sensor of the capacitance type or the like. As an application of the wiring board 1 and the molded object of the wiring board 1, the capacitive touch sensor is exemplified in the above embodiments, but is not limited thereto.

As shown in FIG. 2, the wiring board 1 includes a substrate 10, a first resist layer 20, a second resist layer 30, a first conductor portion 41, an insulation layer 50, a second conductor portion 61, and an overcoat layer 70. The substrate 10 in one or more embodiments corresponds to an example of "a substrate" in the present invention, the first resist layer 20 in one or more embodiments corresponds to an example of "a first resist layer" in the present invention, and the second resist layer 30 in one or more embodiments corresponds to an example of "a second resist layer" in the present invention. Further, the first conductor portion 41 in one or more embodiments corresponds to an example of "a first conductor portion" in the present invention, the second conductor portion 61 in one or more embodiments corresponds to an example of "a second conductor portion" in the present invention, the insulation layer 50 in one or more embodiments corresponds to an example of "an insulation layer" in the present invention, the overcoat layer 70 in the present invention corresponds to an example of "an overcoat layer" in the present invention.

The substrate 10 has a thin plate shape. The substrate 10 is a film for molding used in the molding process such as vacuum forming or thermoforming. The substrate 10 of one or more embodiments is made of a thermoplastic resin which softens at about 100° C. to 200° C. Specific examples of the thermoplastic resin constituting the substrate 10 include a polycarbonate resin, an acrylonitrile butadiene styrene (ABS) resin, an acrylic resin, a cyclic olefin resin, a polyester resin, or a polyacrylate resin. The substrate 10 is molded into a predetermined three-dimensional shape by a mold or the like after being heated to a temperature to soften the above, then the substrate 10 is solidified while maintaining the three-dimensional shape by being subsequently cooled.

The first resist layer 20 is formed on the substrate 10 and is solid at ordinary temperature (e.g., 27° C.) For example, the material constituting the first resist layer 20 may be a resin such as a polyester resin, a polyurethane resin, an acrylic resin, and a silicone resin. Incidentally, the hot melt and the adhesive tape are melted when they are heated to 80° C. or higher at the time of molding. Then, they are broken or peeled from the substrate 10, they can't be used as a material constituting the first resist layer 20. Thus, when the hot melt and the adhesive tape are peeled or broken, the first and second conductor portion 41 and 61 and the overcoat layer 70 may be broken. Further, when the hot melt and the adhesive tape are broken or peeled from the substrate 10, in some cases, the first and second conductor portions 41 and 61 and the overcoat layer 70 is peeled off.

The first resist layer 20 may have a breaking elongation $E_1$ of 50% or more at 100° C. ($E_1 \geq 50\%$). Since the first resist layer 20 can reliably follow to the deformation of the substrate 10 at the time of molding by the first resist layer 20 has a breaking elongation of 50% or more at 100° C., the peeling from the substrate 10 of the first resist layer 20 and the breakage of the first and second conductor portion 41, 61 and the overcoat layer 70 are more hardly caused.

Incidentally, the breaking elongation of the first resist layer 20 can be measured by using the measuring method that conforms to JIS K 7161-1 and JIS K 7161-2. Although not particularly limited, for example, a constant temperature bath tensile test apparatus manufactured by Shimadzu Corporation can be used. The breaking elongation of the first resist layer 20 can be measured by measuring the test piece made of the same material as the first resist layer 20 in a constant temperature bath the ambient temperature set at 100° C.

Further, the glass transition temperature $Tg_1$ of the first resist layer 20 may be 100° C. or less ($Tg_1 \leq 100°$ C.). The first resist layer 20 is intended to soften at 100° C. or less, since the first resist layer 20 can reliably follow to the deformation of the substrate 10 at the time of molding, the peeling from the substrate 10 of the first resist layer 20 and breakage of the first and second conductor portions 41, 61 are more hardly occurred.

The second resist layer 30 is formed on the first resist layer 20 and is solid at ordinary temperature. As a material constituting the second resist layer 30, the same material as that constituting the first resist layer 20 can be used.

In one or more embodiments, the material constituting the first resist layer 20 and the material constituting the second resist layer 30 have the same composition. As described above, since the materials constituting the first and second resist layers 20 and 30 have the same composition, it is possible to further enhance the adhesive strength between the first and second resist layers 20 and 30.

Further, the second resist layer 30, similarly to the first resist layer 20, may have the breaking elongation of 50% or more $E_2$ at 100° C. ($E_2 \geq 50\%$). By the second resist layer 30 has the breaking elongation of 50% or more at 100° C., since the second resist layer 30 can reliably follow to the deformation of the substrate 10 at the time of molding, the peeling from the substrate 10 of the second resist layer 30 and the breakage of the first and second conductor portions 41, 61 are hardly caused.

The glass transition temperature $Tg_2$ of the second resist layer 30, similarly to the first resist layer 20, may be 100° C. or less ($Tg_2 \leq 100°$ C.). The second resist layer 30 is also softened at 100° C. or less, since the second resist layer 30 can reliably follow to the deformation of the substrate 10 at the time of molding, the peeling from the substrate 10 of the second resist layer 30 and the breakage of the first and second conductor portions 41, 61 are hardly occurs.

Incidentally, the material constituting the first resist layer 20 and the material constituting the second resist layer 30 may have different compositions. In this case, the resist material compatible with each other can be used as the material constituting the first resist layer 20 and the material constituting the second resist layer 30.

As shown in FIG. 1, each of the first conductor portion 41 is a linear wire extending along the X direction in FIG. 1. The plurality of first conductor portions 41 are aligned along the Y-direction. As shown in FIG. 2, a plurality of first conductor portions 41 are buried in the second resist layer 30.

Further, as shown in FIGS. 1 and 2, in a plan view as viewed from the Z-direction, the portion intersecting the second conductor portion 61 in the first conductor portion 41 is covered by insulation layer 50, and is electrically insulated from the second conductor portion 61. On the other hand, the portion that does not intersect the second conductor portion 61 in the first conductor portion 41 is covered with the overcoat layer 70.

A first connecting portion 42 is disposed at both ends of the conductor portion 41, the first connecting portion 42 is integrally formed with the first conductor portion 41. The first connecting portion 42 has a convex shape protruding in a direction away from the second resist layer 30, and is exposed from the overcoat layer 70. The first connecting portion 42 is not particularly limited, it can be used as a connection terminal to the electronic device.

The first conductor portion 41 is composed of conductive particles dispersed in the binder, and has a high elongation. By the binder contained in the first conductor portion 41 is composed of a material having a high elongation, the first conductor portion 41 also has a high elongation. As such a binder, an elastomer may be used. For example, a polyester resin, a polyurethane resin, an acrylic resin, a silicone resin, a composite of 2 or more of these, and the like can be used. As the conductive particles, metals such as gold, silver, platinum, ruthenium, lead, tin, zinc, bismuth or the like or metallic materials made of these alloys, or non-metallic materials such as carbon can be used. As the shape of the conductive particles, the shape may be flaky or indefinite.

The first connecting portion 42 is composed of the same material as the first conductor portion 41. Depending on the application of the wiring board 1, the conductive particles included in the first connecting portion 42 may be different types of conductive particles included in the first conductor portion 41. For example, although not particularly limited, carbon may be used as the conductive particles included in the first connecting portion 42, silver may be used as the conductive particles included in the first conductor portion 41.

The insulation layer 50 is interposed between the first conductor portion 41 and a second conductor portion 61, and electrically isolates both. As a material constituting this insulation layer 50, a polyester resin, a polyurethane resin, an acrylic resin, or a silicone resin can be exemplified. Further, the insulation layer 50 may have the breaking elongation $E_3$ of 50% or more at 100° C. ($E_3 \geq 50\%$). Similar to the above, the insulation layer 50 can reliably follow to the deformation of the substrate 10 at the time of mold. Further, the glass transition temperature $Tg_3$ of insulation layer 50 is, for example, 100° C. or less.

As shown in FIG. 1, each of the second conductor portion 61 is a linear wire extending along the Y-direction in FIG. 1. The plurality of second conductor portions 61 are aligned along the X-direction. Each second conductor portion 61, in plan view, is perpendicular to the first conductor portion 41. As shown in FIG. 2, the second conductor portion 61 is provided on the second resist layer 30 and on the insulation layer 50 is covered by the overcoat layer 70.

A second connecting portion 62 is disposed at both ends of conductor portion 61, the second connecting portion 62 is integrally formed with the second conductor portion 61. The second connecting portion 62 has a convex shape protruding in a direction away from the second resist layer 30 is exposed from the overcoat layer 70. The second connecting portion 62 is not particularly limited, it can be used as a connection terminal with the electronic device.

The material constituting the second conductor portion 61 and the second connecting portion 62 is not particularly limited, it is possible to use a conductive material having the same elongation as the first conductor portion 41 and the second connecting portion 62.

The overcoat layer 70 is provided on the second resist layer 30 and covers the first and second conductor portions 41, 61. A plurality of holes 701 penetrating from one main surface to the other main surface is formed in the overcoat layer 70, the first and second connecting portions 42 and 62 are formed in the hole 701.

The material constituting the overcoat layer 70 is not particularly limited, and examples thereof include the same resin materials as those of insulation layer 50 described above. Further, the overcoat layer 70 may have a breaking elongation $E_4$ of 50% or more at 100° C. ($E_4 \geq 50\%$). Similar to the above, the overcoat layer 70 can reliably follow the deformation of the substrate 10 at the time of molding. Further, the glass transition temperature $Tg_4$ of the overcoat layer 70 is, for example, 100° C. or less.

Figure 3:
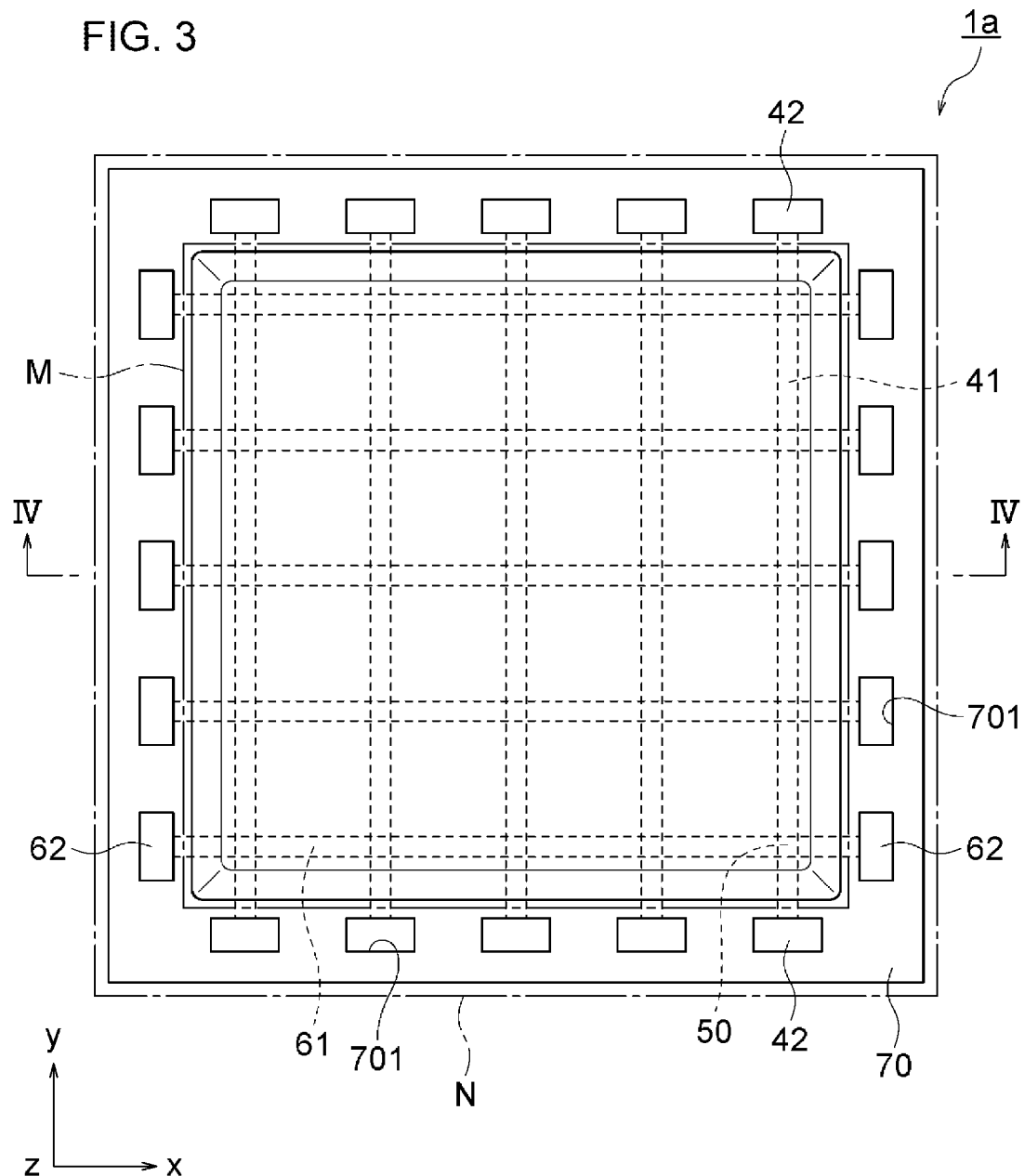
FIG. 3 is a plan view illustrating a molded object according to one or more embodiments of the present invention.
Figure 4:
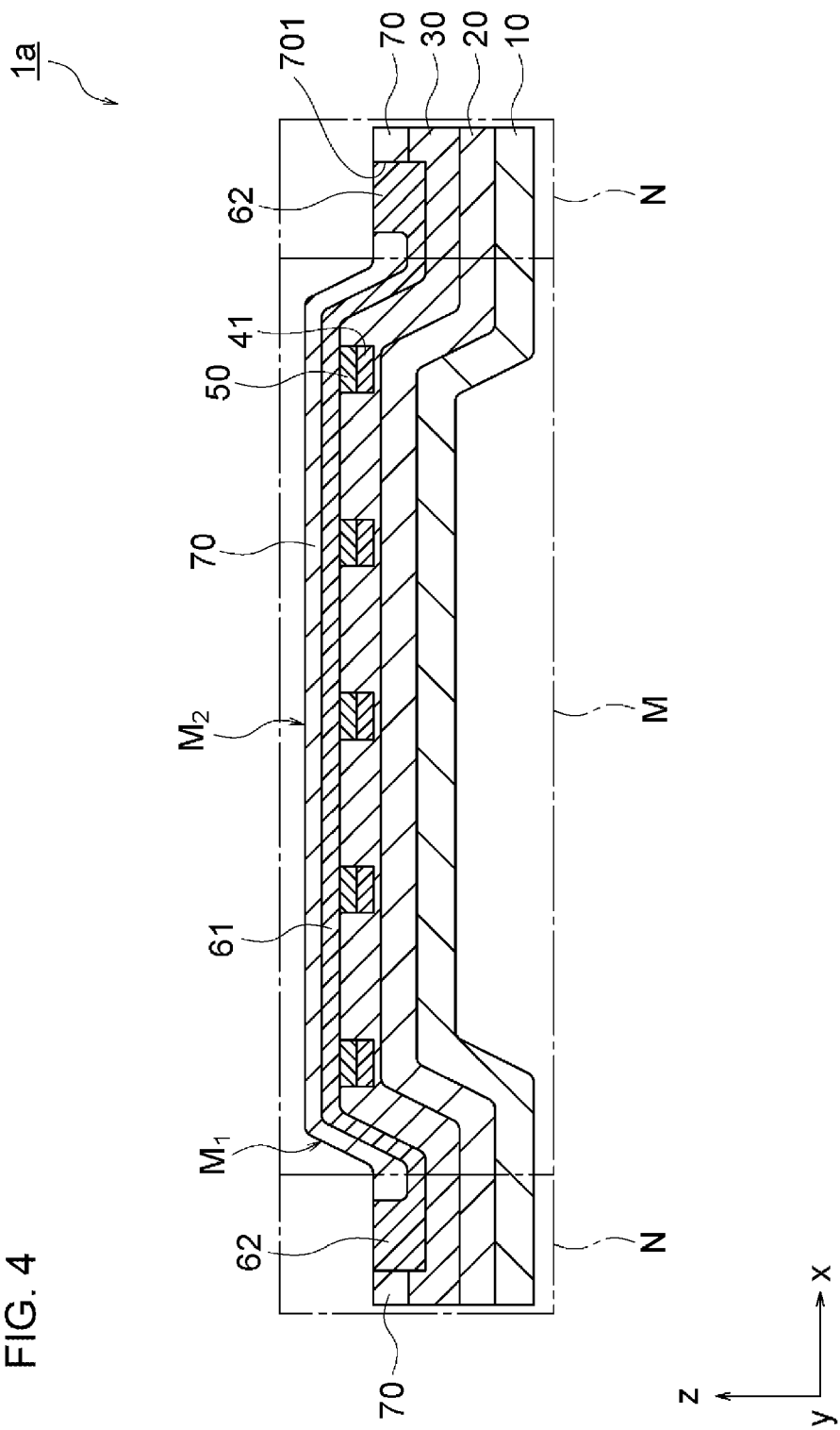
FIG. 4 is a cross-sectional view showing a cross section along IV-IV of FIG. 3.

FIG. 3 is a plan view showing a molded object in one or more embodiments of the present invention, FIG. 4 is a cross-sectional view showing a cross section along IV-IV of FIG. Hereinafter, only the difference with respect to the wiring board 1 of molded object 1a will be described, portions having the same configuration as the wiring board 1 will be omitted with the same reference numerals.

As shown in FIGS. 3 and 4, a molded object 1a is manufactured by molding the wiring board 1 having the planar shape described above into a three-dimensional shape by the vacuum forming or the thermoforming or the like.

As shown in FIGS. 3 and 4, the molded object 1a has a molded portion M which is molded into a three-dimensional shape, and a non-molded portion N which is not molded and has a planar shape. The molded object 1a in one or more embodiments corresponds to an example of "a molded object" in the present invention, the molded portion M in one or more embodiments corresponds to an example of "a molded portion" in the present invention.

The molded portion M has a rectangular planar shape. It is disposed in the central portion of the molded object 1a. The molded portion M is composed of a bending part $M_1$ which bends in the Z-direction, and a flat part $M_2$. The bending part $M_1$ is arranged along the outer perimeter of the flat part $M_2$ and is connected to the outer perimeter of the flat part $M_2$. Therefore, the molded portion M has an outer shape of a convex shape protruding in the Z-direction.

The first and second conductor portions 41, 61 are positioned in the molded portion M. In the molded portion M, the shapes of the first and second conductor portions 41, 61 correspond to the three-dimensional shapes of the molded portion M.

On the other hand, the non-molded portion N has a frame-shaped planar shape, is disposed on the outer peripheral portion of the molded object 1a. The non-molded portion N is entirely has a planar shape, does not have a portion having a convex shape or a portion having a concave shape.

Incidentally, the molded object 1a of one or more embodiments has a three-dimensional shape in which the molded portion M protrudes in the Z-direction, but it is not limited thereto. The shape of molded object 1a is appropriately selected according to the applications of molded object 1a.

Next, a method of manufacturing the molded object 1a as described above will be described with reference to FIGS. 5 to 9.

<<First Manufacturing Method>>

Figure 5:
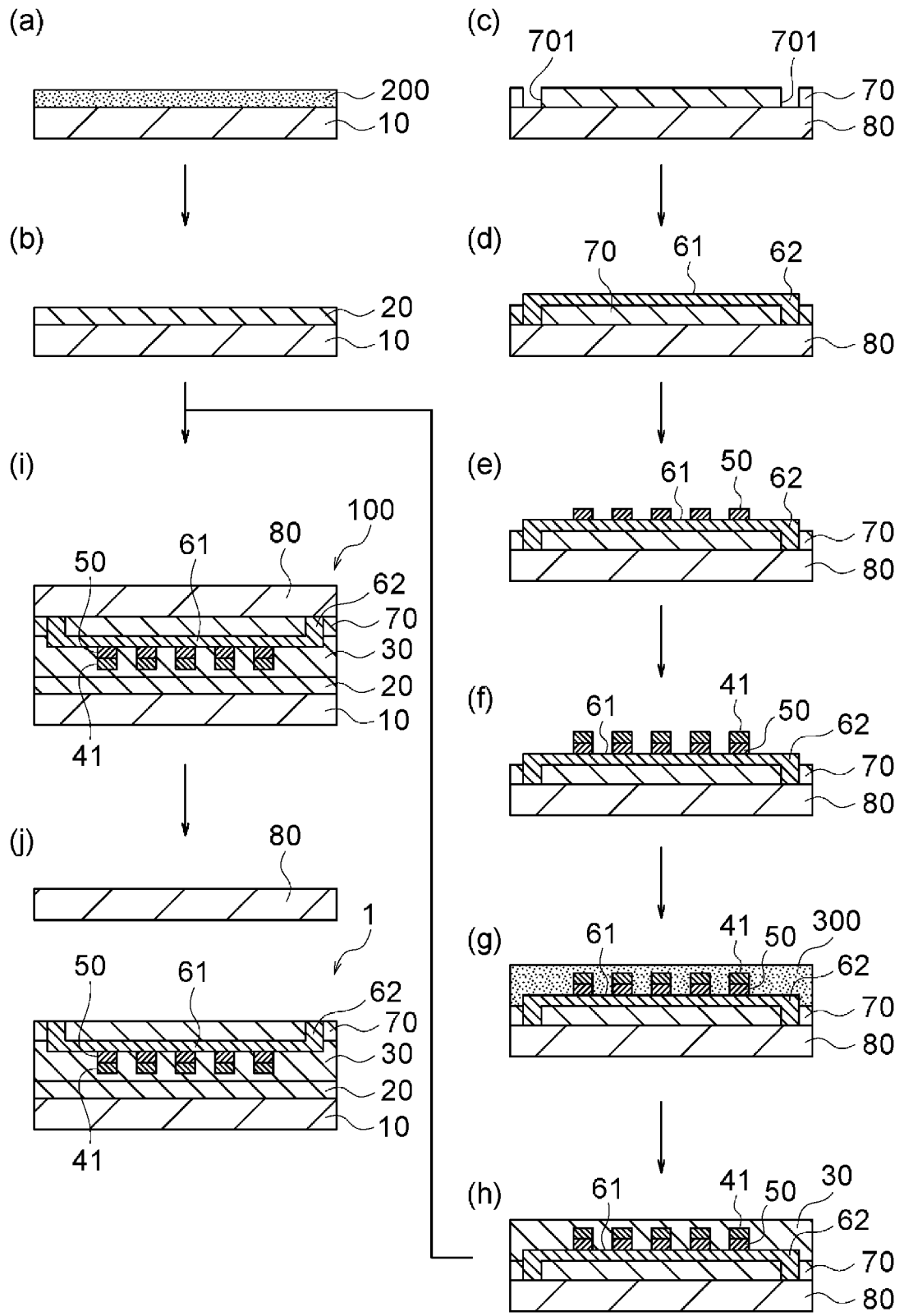
FIGS. 5 (*a*) to 5 (*j*) are cross-sectional views showing a first manufacturing method of the wiring board in one or more embodiments of the present invention.

FIGS. 5 (a) to 5 (j) are cross-sectional views showing a first manufacturing method of the wiring board in one or more embodiments of the present invention. FIGS. 6 (a) and 6 (b) are cross-sectional views for explaining thermocompression bonding step shown in FIG. 5 (i) in detail. FIGS. 7(a) to 7(c) are cross-sectional views illustrating a forming step of a manufacturing method of a molded object according to one or more embodiments of the present invention.

First, as shown in FIG. 5 (a), the first resist material 200 is disposed on the substrate 10. As the substrate 10, the above-described thermoplastic resin can be used. As the first resist material, the above-described resist material can be used.

For example, the first resist material 200 is disposed on the substrate 10 by application. As the applying method, specifically, various applying methods such as a screen printing method, a spray coating method, a bar coating method, a dip method, an ink jet method, and the like can be used. The step shown in FIG. 5 (a) of one or more embodiments corresponds to an example of "a first disposing step" in the present invention.

Next, as shown in FIG. 5(b), the first resist material 200 is cured to form a first resist layer 20. As the curing method of the first resist material 200, for example, ultraviolet, energy irradiation such as infrared laser light, heating, heating and cooling, drying, or the like can be used. In the case where heating is used as the curing method, for example, the first resist material 200 can be cured by heating the first resist material 200 to 80° C. to 100° C. using a far-infrared heating furnace (IR furnace). The step shown in FIG. 5 (b) of one or more embodiments corresponds to an example of "a first curing step" in the present invention.

Next, as shown in FIG. 5 (c), separately from the substrate 10 described above, a release film 80 is prepared, and the overcoat layer 70 is formed on the release film 80. At this time, on the release film 80, the overcoat layer 70 is not formed at the portion where the hole 701 is formed.

The release film 80 is a resin film subjected to a release treatment, it is not particularly limited, for example, a release treatment PET film can be used as the release film 80. As the release treatment, for example, a method of forming a release material layer by applying a release agent on a resin film and drying the applied release agent can be used. As the release agent, a silicone-based release agent and a fluorine-based release agent can be used.

The overcoat layer 70 is formed by coating the material constituting the overcoat layer 70 described above on the release film 80 and curing the material. As the applying method, various coating methods such as a screen printing method, a spray coating method, a bar coating method, a dip method, and an inkjet method can be employed. As a curing method, irradiation with energy rays such as ultraviolet rays and infrared laser rays, heating, heating and cooling, and drying, or the like can be employed. Further, when heating is used as the curing method, for example, the overcoat layer 70 can be formed by heating the material constituting the overcoat layer 70 to 100° C. to 150° C. using an IR furnace.

The release film 80 in one or more embodiments corresponds to an example of "a release film" in the present invention, the overcoat layer 70 in one or more embodiments corresponds to an example of "a resin layer" in the present invention, the steps shown in FIG. 5 (c) of one or more embodiments corresponds to an example of "a first forming step" in the present invention.

Next, as shown in FIG. 5 (d), the second conductor portion 61 is formed on the overcoat layer 70. At this time, the second connecting portion 62 is formed in the hole 701.

The second conductor portion 61 is formed by applying a conductive paste onto the overcoat layer 70 and curing the paste. At this time, the conductive paste is also filled and cured in the hole 701 of the overcoat layer 70. As a specific example of such a conductive paste, a conductive paste composed by mixing conductive particles, a binder, water or a solvent, and various additives can be exemplified. Examples of the solvent contained in the conductive paste include butyl cellosolve acetate, carbitol acetate, butyl carbitol acetate, dipropylene glycol monobutyl Ether, diethylene glycol monoethyl Ether, cyclohexanone, isophorone, and terpineol. As for the method of applying the conductive paste and the method of curing, the same method as that in the case of forming the overcoat layer 70 can be used.

Next, as shown in FIG. 5 (*e*), the insulation layers 50 are formed on a part of the second conductor portion 61. In the step of FIG. 5 (*f*) to be described later, the insulation layers 50 are formed on a portion of the upper surface of the second conductor portion 61, where the first conductor portions 41 will be formed. The insulation layers 50 are made of a material similar to the overcoat layer 70, and can be formed by the applying method and the curing method similar to the methods of forming the overcoat layer 70.

Next, as shown in FIG. 5 (*f*), the first conductor portions 41 are formed. The first conductor portions 41 is formed on the insulation layer 50 and the overcoat layer 70 described above. In the cross-sectional view shown in FIG. 5 (*f*), a portion of the first conductor portion 41 that is formed on the overcoat layer 70 is not shown. Further, although not shown in the cross section of FIG. 5 (*f*), at the same time, the first connecting portions 42 are formed in the holes 701 of the overcoat layer 70.

The first conductor portion 41 and the first connecting portion 42 are composed of the same material as the second conductor portion 61 and the second connecting portion 62, they can be formed by the same method as the methods of forming the second conductor portion 61 and the second connecting portion 62 described above. Further, the steps shown in FIGS. 5(*d*) to 5(*f*) in one or more embodiments correspond to an example of "a second forming step" in the present invention.

Next, as shown in FIG. 5 (*g*), a second resist material 300 is disposed on the first and second conductor portions 41, 61, the first and second connecting portions 42, 62, and the overcoat layer 70. As the second resist material 300, the material having the same composition as that of the first resist material 200 can be used. The second resist material 300 can also be disposed by application similar to that of the first resist material 200. The steps shown in FIG. 5 (*g*) in one or more embodiments correspond to an example of "a second disposing step" in the present invention.

Next, as shown in FIG. 5(*h*), the second resist material 300 is cured to form a second resist layer 30. As a method of curing the second resist material 300, the same method as that of the curing method of the first resist material 200 described above can be used. The step shown in FIG. 5 (*h*) in one or more embodiments corresponds to an example of "a second curing step" in the present invention.

Next, as shown in FIG. 5 (*i*), after the first resist layer 20 and the second resist layer 30 are brought into contact each other, the first resist layer 20 and the second resist layer 30 are thermocompression bonded. Here, the thermocompression bonding method in one or more embodiments will be described in detail with reference to FIGS. 6 (*a*), 6 (*b*).

The thermocompression bonding method in one or more embodiments, a thermocompression machine 900 as shown in FIG. 6 (*a*) can be used. The thermocompression bonding machine 900 comprises a crimp head 901 and a crimp stage 902. The crimp head 901 comprises a heater (not shown), and has a function of raising the temperature of the crimp head 901 to a predetermined temperature. Further, the crimp head 901 can be relatively close to the crimp stage 902, thereby the crimp head 901 can press the object to be crimped on the crimp stage 902 toward the crimp stage 902.

In the thermocompression bonding method using the thermocompression machine 900, first, as shown in FIG. 6 (*a*), the intermediate 100 is produced by contacting the first resist layer 20 with the second resist layer 30, and the intermediate 100 is placed on the crimp stage 902. The step shown in FIG. 6 (*a*) of one or more embodiments corresponds to an example of "a bonding step" in the present invention.

Next, as shown in FIG. 6 (*b*), after heating the crimp head 901 to a predetermined temperature, the crimp head 901 is pressed against the intermediate 100. Thus, the first resist layer 20 and the second resist layer 30 are thermocompression bonded.

In this thermocompression bonding, the temperature of the crimp head 901 may be, for example, 100° C. to 150° C., and the crimp time may be, for example, 10 seconds to 120 seconds. At this time, the first and second resist layers 20 and 30 of the intermediate 100 are heated to 80° C. to 130° C. The steps shown in FIG. 6 (*b*) of one or more embodiments corresponds to an example of "a thermocompression bonding step" in the present invention.

Next, as shown in FIG. 5 (*j*), the release film 80 is peeled from the overcoat layer 70 to produce the wiring board 1. The steps shown in FIG. 5 (*j*) in one or more embodiments corresponds to an example of "a releasing step" in the present invention.

Next, by thermoforming the wiring board 1 produced as described above as shown in FIGS. 7 (*a*) to 7 (*c*), it is possible to produce the molded object 1*a* of one or more embodiments.

Figure 7:
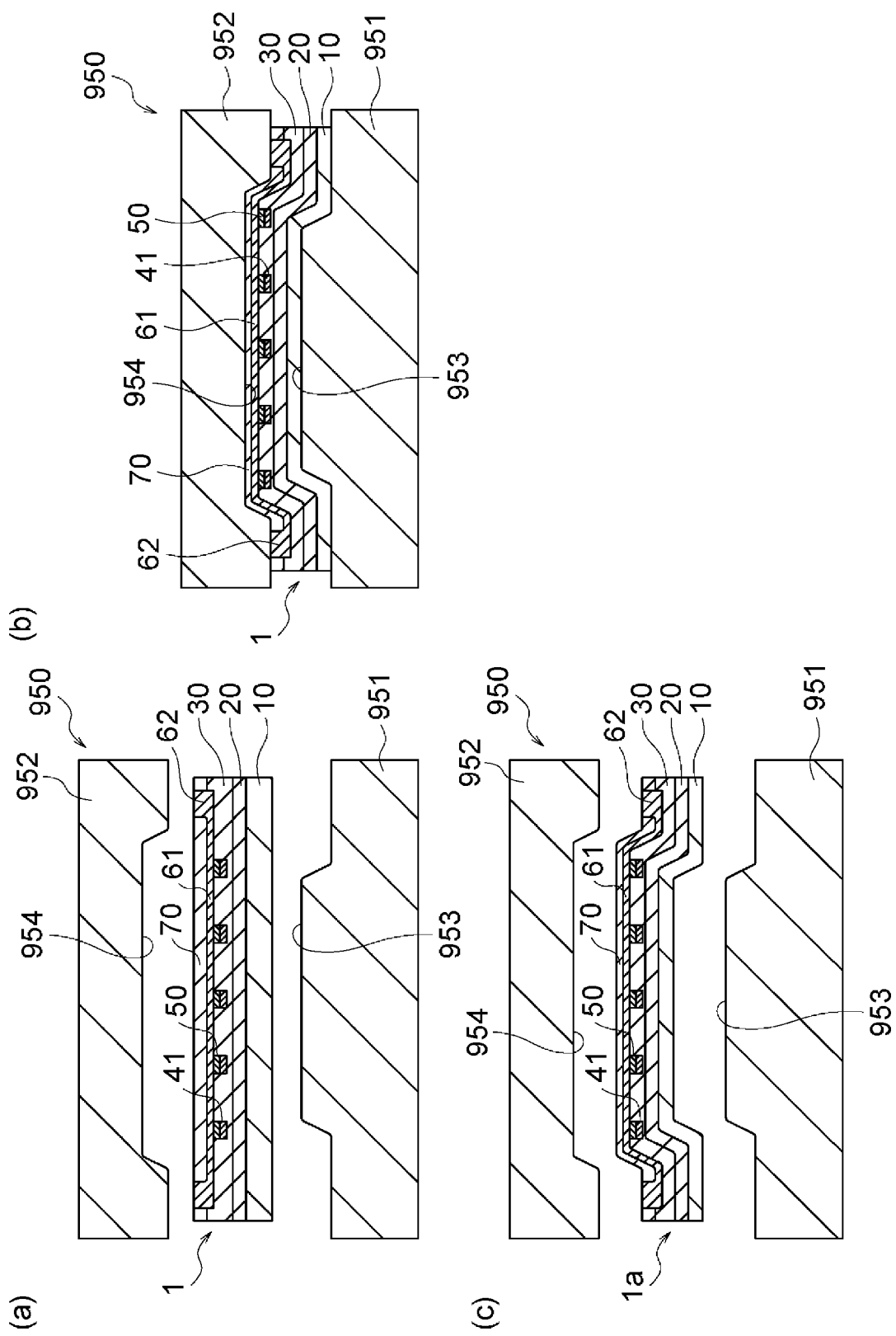
FIGS. 7(*a*) to 7(*c*) are cross-sectional views illustrating a forming step of a manufacturing method of a molded object according to one or more embodiments of the present invention.

As shown in FIG. 7 (*a*), a mold 950 is used in the thermoforming of one or more embodiments. The mold 950 has a convex 951 and concave 952 to fit each other, each of the fitting surfaces 953 and 954 of the convex 951 and concave 952 has a shape corresponding to the three-dimensional shape of molded object 1*a*.

In the thermoforming method using the mold 950, as shown in FIG. 7 (*b*), after the temperatures of the convex 951 and concave 952 are raised to a predetermined temperature, the wiring board 1 is sandwiched by the fitting surfaces 953 and 954 of the convex 951 and concave 952 from above and below.

At this time, the temperature of the mold 950 may be a temperature at which the substrate 10 can be deformed. At this time, the first and second resist layers 20 and 30 are heated to 100° C. to 200° C.

Next, as shown in FIG. 7 (*c*), the molded object 1*a* is manufactured by separating the convex 951 from the concave 952. The steps shown in FIGS. 7(*a*) to 7(*c*) of one or more embodiments correspond to an example of "a molding step" in the present invention.

In one or more embodiments, the thermoforming is exemplified as the molding method, but it is not limited thereto, the molding method may be a vacuum forming. When the vacuum forming is used, the wiring board 1 is vacuum adsorbed to a mold having the same shape as the convex 951 described above after softening the wiring board 1 by heating. Thereafter, the wiring board 1 is cooled while being shaped along the mold. Thus, the above-described molded object 1*a* is manufactured.

As described above, in one or more embodiments, without repeatedly performing heating on the substrate 10, a plurality of the layers (the first and second conductor portions 41, 61, the insulation layer 50, and the overcoat layer 70) on the release film 80 is transferred onto the substrate 10 after forming. Therefore, until prior to the bonding step, the layers are formed with separated from the substrate 10, the heat is not applied to the substrate 10 repeatedly. Therefore, the occurrence of shrinkage and distortion of the substrate 10 can be suppressed, the occurrences of breakage in the first and second conductor portions 41, 61 are suppressed.

Further, in one or more embodiments, since the first resist layer 20 is formed on the substrate 10 side, it is possible to improve the adhesion of the second resist layer 30 and the first resist layer 20. Therefore, at the time of the molding, the first and second conductor portions 41, 61, insulation layer 50, and the overcoat layer 70 can follow reliably to deformation of the substrate 10.

Further, in one or more embodiments, even when a material having low heat resistance and a large linear expansion coefficient such as a polycarbonate resin or an ABS resin is used as the substrate 10, the occurrences of shrinkage and strain of the substrate 10 are suppressed.

Further, in one or more embodiments, the multilayer conductor portions (the first and second conductor portions 41, 61) are formed. Conventionally, when the multilayer conductor portions are formed, the number of times of heating of the substrate is further increased, there is a case where the shrinkage and distortion of the substrate becomes larger. In contrast, in one or more embodiments, even if the total number of the conductor portions is increased, only the number of heatings of the release film 80 is increased. That is, since the number of heatings of the substrate 10 is not increased, the occurrences of shrinkage and distortion of the substrate 10 can be suppressed.

In addition, in one or more embodiments, the overcoat layer 70, the first and second conductor portions 41, 61 are bonded to the substrate 10 via the first and second resist layers 20, 30. The first and second resist layers 20, 30 don't lose adhesion even under a temperature during molding as described later, and they can follow to the deformation of the substrate 10 even under a temperature at the time of the molding. Therefore, the occurrence that the first and second resist layers 20, 30 are peeled from the substrate 10 at the time of the molding, the occurrence of breakage of the first and second conductor portions 41, 61 is suppressed. In contrast, when the hot melt or the adhesive tape are used instead of the first and second resist layers 20, 30, since the hot melt and the adhesive tape are melted at a temperature during molding, peeling of the substrate 10 and breakage of the first and second conductor portions 41, 61 occur.

Further, the wiring board 1 and the molded object 1a of one or more embodiments have a first and second resist layers 20, 30 bonded to each other, it is possible to improve the peel strength. Therefore, the occurrence that the first and second conductor portions 41, 61 and the overcoat layer 70 are peeled from the substrate 10 can be suppressed, and the occurrence of breakage of the substrate 10, the first and second conductor portions 41, 61, and the overcoat layer 70 can be suppressed.

<<Second Manufacturing Method>>

Figure 8:
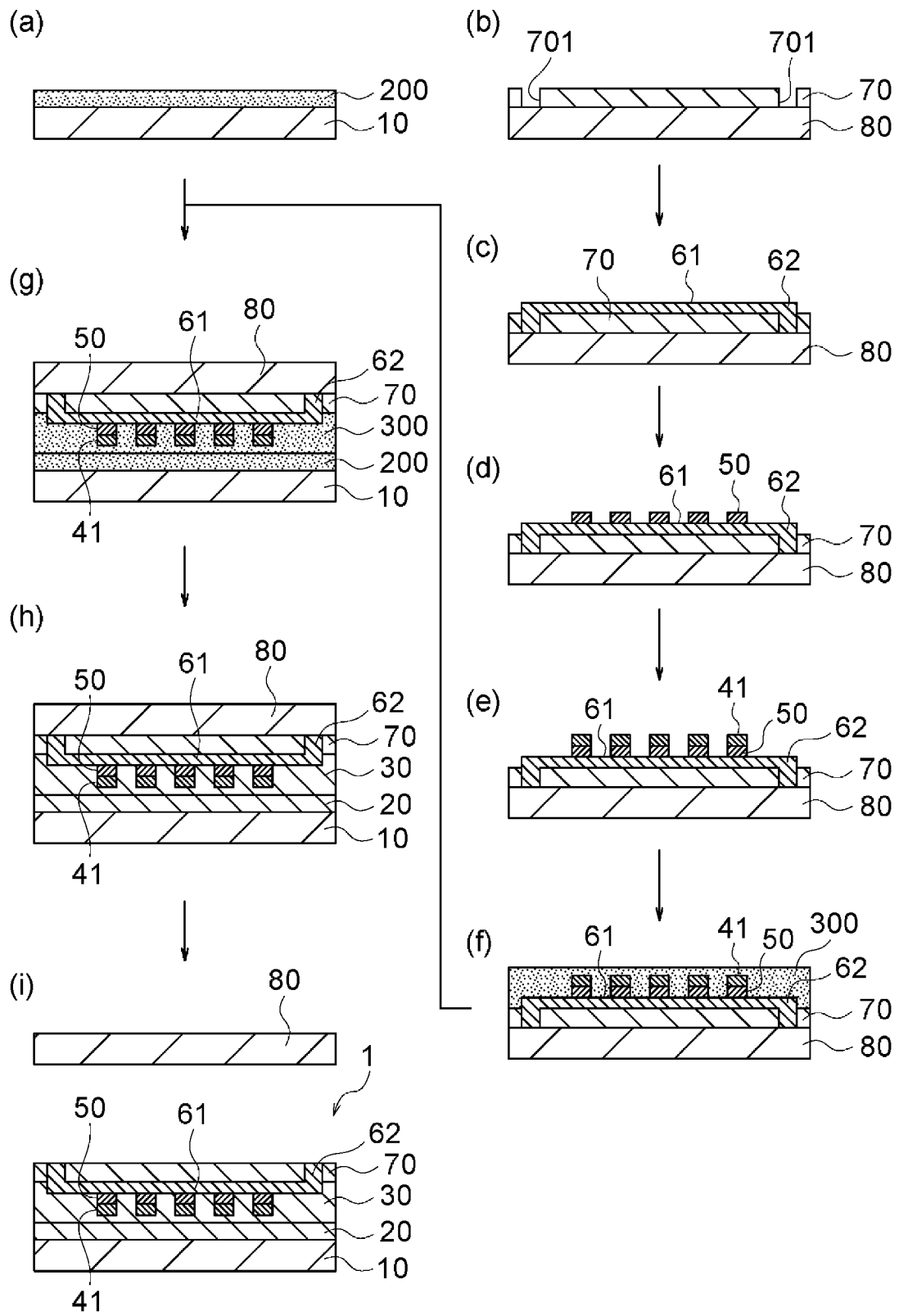
FIGS. 8 (*a*) to 8 (*i*) are cross-sectional views showing a second manufacturing method of the wiring board in one or more embodiments of the present invention.

FIGS. 8 (a) to 8 (i) are a cross-sectional view showing a second manufacturing method of the wiring board 1 in one or more embodiments of the present invention. Here, the second manufacturing method is different from the first manufacturing method on the point that the first resist material 200 and the second resist material 300 are contacted with before they are cured. But other configurations are the same as those of the first manufacturing method.

First, as shown in FIG. 8 (a), the first resist material 200 is formed on the substrate 10. This step is the same step as in FIG. 5 (a) of the first manufacturing method.

Next, as shown in FIGS. 8 (b) to 8 (f), the overcoat layer 70, the second conductor portion 61 and the second connecting portion 62, the insulation layer 50, the first conductor portion 41 and the first connecting portion 42, and the second resist material 300 are formed in this order on the release film 80. These steps are the same steps as in FIGS. 5(c) to 5(g) of the first manufacturing method.

Next, as shown in FIG. 8 (g), the first and second resist materials 200, 300 in the paste state before curing are contacted with. This step shown in FIG. 8 (g) corresponds to an example of "a bonding step" in the present invention.

Next, as shown in FIG. 8(h), the first and second resist materials 200, 300 are cured to form the first resist layer 20 and the second resist layer 30.

Next, as shown in FIG. 8 (i), the release film 80 is peeled from the overcoat layer 70 and the second connecting portion 62, to manufacture the wiring board 1. This step is the same step as in FIG. 5 (j) of the first manufacturing method.

Next, the wiring board 1 produced as described above is thermoformed by the above method described with FIGS. 7 (a) to 7 (c), the molded object 1a of one or more embodiments is manufactured.

In the above-described method of manufacturing the circuit board 1 and the molded object 1a, since the first and second resist materials 200 and 300 are contacted and then cured, the number of heating of the substrate 10 increases by one as compared with the first manufacturing method, but the number of times of heating of the substrate 10 decreases as compared with the method of forming the first and second conductor portion and the overcoat layers on the substrate. Therefore, even when this manufacturing method is used, the occurrences of shrinkage and distortion of the substrate 10 in the wiring board 1 and the molded object 1a can be suppressed, the occurrence of breakage of the first and second conductor portions 41, 61 can be suppressed.

<<Third Manufacturing Method>>

FIGS. 9 (a) to 9 (l) are cross-sectional views showing other manufacturing methods of the molded object 1a in one or more embodiments of the present invention. Here, the third manufacturing method that the substrate 10 is molded in advance prior to the contacting step is different from the first manufacturing method that the wiring board is molded, but other configurations are the same as the first manufacturing method.

First, as shown in FIG. 9 (a), the substrate 10 is prepared. Next, as shown in FIG. 9 (b), the substrate 10 is molded. Thus, the molded portion M and the non-molded portion N is formed in the substrate 10. As the molding method of the substrate 10, the above-described thermoforming or vacuum molding can be used.

Next, as shown in FIG. 9(c), the first resist material 200 is disposed on the molded substrate 10, and the first resist layer 20 is formed by curing the first resist material 200 as shown in FIG. 9(d).

Next, as shown in FIGS. 9 (e) to 9 (j), the overcoat layer 70, the second conductor portion 61 and the second connecting portion 62, the insulation layer 50, the first conductor portion 41 and the first connecting portion 42, and the second resist layer 30 are formed on the release film 80, in this order. These steps are the same steps as in FIGS. 5(c) to 5(h) of the first manufacturing method.

Next, as shown in FIG. 9 (k), after contacting the first resist layer 20 with the second resist layer 30, they are thermocompression bonded each other. At this time, the release film 80, the overcoat layer 70, the second conductor portion 61, insulation layer 50, the first conductor portion 41, and the second resist layer 30 are shaped along the three-dimensional shape of the substrate 10. As the thermocompression bonding method, the same method as in FIGS. 6 (a), 6 (b) above can be used.

Next, as shown in FIG. 9 (*l*), the release film 80 is peeled from the overcoat layer 70 and the second connecting portion 62 to manufacture the wiring board 1. This step is the same step as in FIG. 5 (*j*) of the first manufacturing method.

In the third manufacturing method described above, similarly to the first manufacturing method, these layers are formed on the release film 80 without repeatedly performing heating on the substrate 10, and then they are transferred onto the substrate 10. Therefore, similarly to the first manufacturing method, the occurrences of shrinkage and distortion of the substrate 10 can be suppressed, and the occurrence of breakage of the first and second conductor portions 41, 61 can be suppressed.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, the conductor portion of the above embodiments has two conductor portions 41, 61, the number of layers of conductor portions are not limited thereto. The number may be one, or three or more. Although conductor portion of the above embodiments is the linear wire, the planar shape of conductor portion is not particularly limited thereto, it may be any shape.

The first conductor portion 41 and the second conductor portion 61 of the above embodiments is electrically completely insulated, but is not limited thereto. They may be partially connected according to the application of the molded object 1*a*.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 . . . Wiring board
1*a* . . . Molded object
10 . . . Substrate
20 . . . First resist layer
30 . . . Second resist layer
41 . . . First conductor portion
42 . . . First connection portion
50 . . . Insulation layer
61 . . . Second conductor portion
62 . . . Second connection portion
70 . . . Overcoat layer
701 . . . Hole
80 . . . Releasing film
M . . . Molded portion
N . . . Non molded portion
100 . . . Intermediate
200 . . . First resist material
300 . . . Second resist material
900 . . . Thermocompression bonding machine
901 . . . Crimp head
902 . . . Crimping stage
950 . . . Mold
951 . . . Convex
952 . . . Concave
953, 954 . . . Fitting surfaces

The invention claimed is:

1. A method for manufacturing a wiring board, comprising:
disposing a first resist material on a substrate;
forming a first resist layer by curing the first resist material;
forming a resin layer on a release film;
forming a conductor portion on the resin layer;
covering the conductor portion by disposing a second resist material on the resin layer;
forming a second resist layer by curing the second resist material;
bringing the first resist layer into contact with the second resist layer, and thereafter bonding the first resist layer and the second resist layer by thermocompression bonding; and
releasing the release film from the resin layer, wherein
the conductor portion comprises:
a first conductor portion; and
a second conductor portion,
the wiring board comprises an insulation layer interposed between the first and second conductor portions, and
the forming of the conductor portion on the resin layer comprises:
forming the second conductor portion on the resin layer;
forming the insulation layer on at least a part of the second conductor portion; and
forming the first conductor portion on both of the resin layer and the insulation layer.

2. The method according to claim 1, wherein
the first resist layer has a breaking elongation of 50% or more at 100° C., and
the second resist layer has a breaking elongation of 50% or more at 100° C.

3. The method according to claim 1, wherein a composition of the first resist material is same as a composition of the second resist material.

4. The method according to claim 1, wherein the substrate is composed of acrylonitrile-butadiene-styrene (ABS) resin or polycarbonate.

5. A method for manufacturing a molded object, comprising:
manufacturing a wiring board using the method according to claim 1; and
forming a molded portion into a three-dimensional shape by molding at least a part of the wiring board, wherein
at least a part of the conductor portion is disposed in the molded portion.

6. A method for manufacturing a molded object, comprising:
manufacturing a wiring board using the method according to claim 1; and
before disposing the first resist material on the substrate, forming a molded portion into a three-dimensional shape by molding at least a part of the substrate, wherein
at least a part of the conductor portion is disposed on the molded portion through the first and second resist layers.

7. A method for manufacturing a wiring board, comprising:
disposing a first resist material on a substrate;
forming a resin layer on a release film;
forming a conductor portion on the resin layer;
covering the conductor portion by disposing a second resist material on the resin layer;

bringing the first resist material into contact with the second resist material, and thereafter forming a first resist layer and a second resist layer by respectively curing the first resist material and the second resist material; and releasing the release film from the resin layer, wherein the conductor portion comprises:
- a first conductor portion; and
- a second conductor portion, the wiring board comprises an insulation layer interposed between the first and second conductor portions, and the forming of the conductor portion on the resin layer comprises:
- forming the second conductor portion on the resin layer;
- forming the insulation layer on at least a part of the second conductor portion; and
- forming the first conductor portion on both of the resin layer and the insulation layer.

* * * * *